United States Patent [19]
Tustin et al.

[11] Patent Number: 6,026,350
[45] Date of Patent: *Feb. 15, 2000

[54] SELF-FRAMING SERIAL TRIGGER FOR AN OSCILLOSCOPE OR THE LIKE

[75] Inventors: Warren S. Tustin; Matthew S. Holcomb, both of Colorado Springs, Colo.

[73] Assignee: Hewlett Packard Company, Palo Alto, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/707,803

[22] Filed: Aug. 30, 1996

[51] Int. Cl.⁷ ....................................................... G06F 11/00
[52] U.S. Cl. ................................................ 702/73; 702/74
[58] Field of Search ...................................... 364/487, 480, 364/481, 579, 580; 395/551, 552, 555, 559; 345/134; 368/115; 340/825.14, 825.17; 307/87; 714/712; 702/57, 66, 79, 74, 73; 710/30

[56] References Cited

U.S. PATENT DOCUMENTS

| | | | |
|---|---|---|---|
| 3,843,893 | 10/1974 | Terry | 307/87 |
| 4,513,419 | 4/1985 | Small | 714/712 |
| 4,585,975 | 4/1986 | Wimmer | 364/487 X |
| 5,294,921 | 3/1994 | Hotka et al. | 340/825.17 |
| 5,295,080 | 3/1994 | Averill | 364/487 |

*Primary Examiner*—Melanie A. Kemper
*Attorney, Agent, or Firm*—Edward L. Miller

[57] ABSTRACT

A self-framing serial trigger within an oscilloscope or specialized analyzer construes an absence of the data's clock signal for at least a selected length of time as implying the occurrence of a framing signal. This frees the serial trigger from otherwise needing an externally supplied framing signal. The serial trigger may include a shift register containing the most recent N-bits of the data, which is then bit-wise compared to the trigger pattern (stored in a register). This level of comparison may provide for don't care bits in the trigger pattern. The results of this bit-wise comparison are then inspected for a certain uniformity indicating that the trigger pattern has been matched. An additional circuit may count clock signals since the last implied framing pulse. If this additional count has not yet reached M (or counted down from M to zero) the match is premature, and no trigger signal is generated. The implied framing signal itself may be generated by loading a down counter with a preselected value each time a selected edge occurs in the clock for the data. The down counter is clocked by a high speed clock running several times faster than the clock for the data. If the down counter ever reaches zero a framing pulse is implied. The implied framing pulse may be generated by decoding a value of zero in the down counter.

1 Claim, 3 Drawing Sheets

SELF-FRAMING SERIAL TRIGGER FOR AN OSCILLOSCOPE OR THE LIKE

BACKGROUND OF THE INVENTION

In many data acquisition or data processing environments data is routed to a measurement device, or between functional elements within an apparatus, as a serial stream of bits. The electrical signals comprising such a data path may be single ended (data is one conductor measured with respect to a system ground) or balanced (differential signals on a pair of conductors). The serial stream of data may be accompanied by a clock signal on a separate conductor, or it may be self-clocking. Whatever the electrical nature of the serial data and its clock, they are susceptible of measurement by oscilloscopes and various specialized types of analyzers. Oscillographic presentations are generally waveforms, while analyzers may present captured data either as waveforms or as symbols arranged in tabular form. In either case it is generally necessary or desirable to capture and display only conditions surrounding an event of interest. The detection of such events is called triggering. A serial trigger is a functional element that is responsive to the serial stream of data and its associated clock by detecting the occurrence of a stated pattern in the data and producing a transition in a trigger signal.

To define such a pattern is to also specify the number of consecutive bits that the pattern is to occupy. We shall term that number N, and expect N to be at least one, and no larger than some reasonable (although still arbitrary) limit. We shall say that N defines a word length for a trigger word. Since it is often convenient for all words to be of the same length, it is fair to equate serial word length with the corresponding concept of word width that occurs in parallel architectures. But whereas each instance of a clock signal in a parallel environment can indicate a new word, in a serial environment there must be N cycles of the clock. This raises the question of which such clock cycle is associated with the start of a new word. A signal that indicates the start of a new word is called a framing signal, or sometimes a framing pulse. In a situation where there is no larger construct formed of individual words, then each Nth clock cycle could serve as a framing pulse, once the progression has been started, but this still requires that an initial clock cycle be identified as synchronous with the start of the word. We shall term such an initial/Nth clock cycle a framing clock cycle. It is possible that a separate signal indicates the framing pulse. Another circumstance is that there are times when there is no clock signal for at least a minimum length of time. Then the first clock cycle thereafter ought to be a framing clock cycle.

It is also possible to have multiple words between framing pulses. In such a circumstance we would say that a framing pulse identifies the start of a record, and that a record comprises a number of words.

Given all these possibilities, it would be useful if a serial trigger were able to accept an N-bit trigger pattern definition and an M-bit delay past the framing pulse, until after which delay the serial trigger ignores any pattern matches between the incoming data and the pattern. M might be arbitrary, but is most likely to be zero, N, 2N, etc. Such an arrangement for a serial trigger allows for its use with either the case where a frame is a single word or the case where a frame is a record of two or more words. It allows the trigger word to be positioned at any word within a record. Further flexibility is gained by allowing selected bits within the trigger pattern to be defined as "don't care" bits.

The above remarks, while true, may apply most particularly to communication channels between systems. Internally, many serial systems operate asynchronously with respect to the start of words. That is, the absence of a clock signal for the above mentioned minimum length of time is an implied framing pulse, or is at least a start of word indicator. (This idea can be realized with and without a separate framing pulse.) For example, a system might issue an instruction to load a certain register from a particular bus. Then the next N-many clock cycles on that bus are associated with the N bits on that bus that are to be serially clocked into the register. Another more general case might be any serially programmed mechanism. Consider an oscilloscope or specialized analyzer connected to a serial data path associated with a system. The desired measurement requires the use of a serial trigger, but no framing pulse or other explicit start-of-word signal is readily available. What to do?

SUMMARY OF THE INVENTION

A solution to the problem of performing a serial trigger function within an oscilloscope or specialized analyzer, without supplying a framing pulse thereto, is to construe the absence of the clock signal for at least a selected length of time as implying the occurrence of a framing signal. Such a serial trigger may be said to be self-framing. The serial trigger may include a shift register containing the most recent N-bits of the data, which is then bit-wise compared to the trigger pattern (stored in a register). This level of comparison may provide for don't care bits in the trigger pattern. The results of this bit-wise comparison are then inspected for a certain uniformity, which, if it occurs indicates that the trigger pattern has been matched. Meanwhile, another circuit has been counting clock signals since the last implied framing pulse. If the count has not yet reached M (or counted down from M to zero) the match is premature, and no trigger signal is generated.

The implied framing signal itself may be generated by loading a counter with a preselected value each time a selected edge occurs in the clock for the data. The counter is clocked by a suitable clock signal that may, but need not necessarily, run faster than the clock for the data. If the counter ever reaches a selected value, then a framing pulse is implied. The counter may be a down counter and the implied framing pulse may be generated by detecting a terminal count of zero in the down counter.

DESCRIPTION OF A PREFERRED EMBODIMENT

Figure 1:
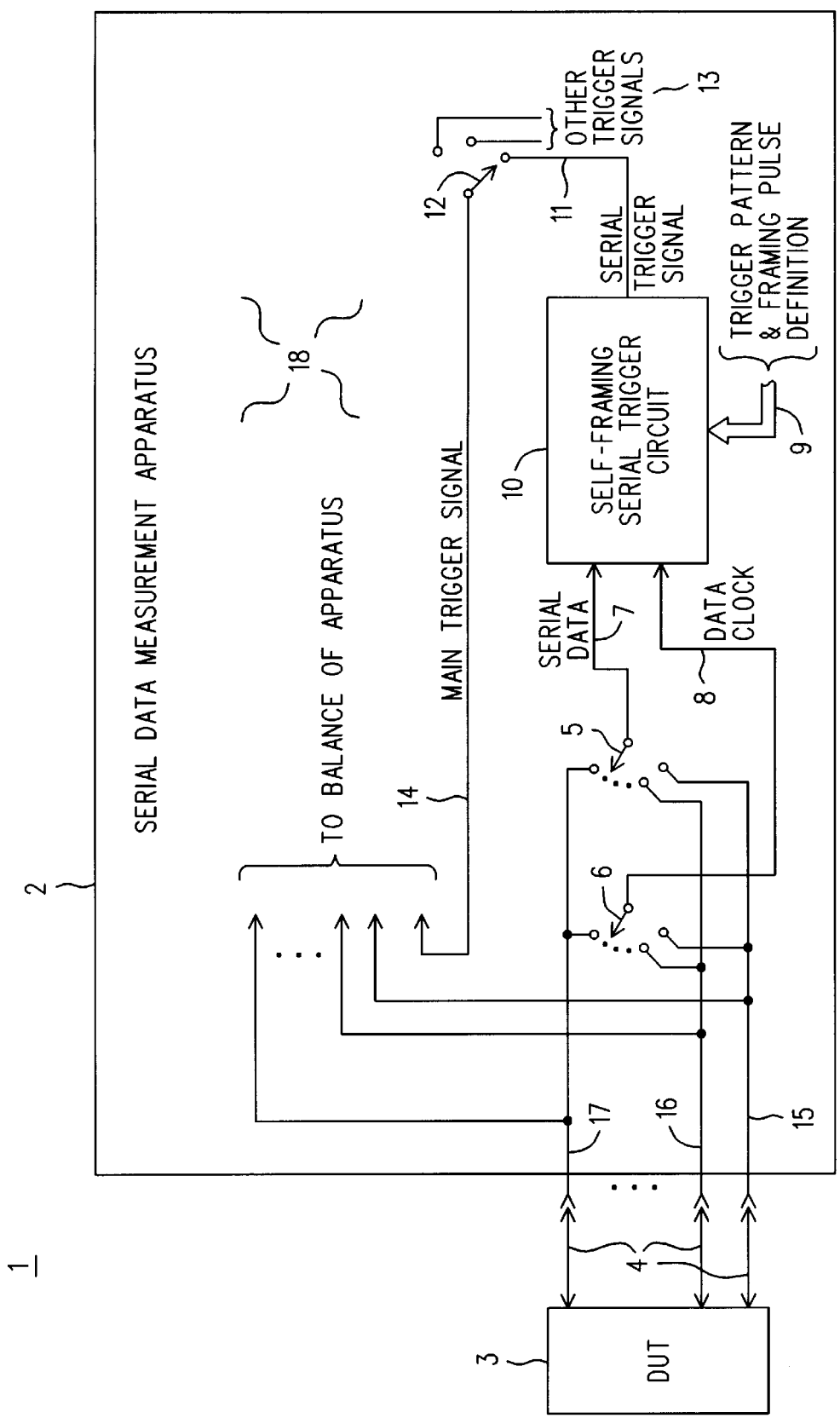
FIG. 1 is a simplified block diagram of an exemplary apparatus, such as an oscilloscope, for the measurement of serial data and which incorporates a self-framing serial trigger circuit constructed in accordance with the invention.

Refer now to FIG. 1, wherein is shown a simplified block diagram 1 of a serial data measurement apparatus 2, which may, but need not necessarily, be an oscilloscope. It might, for example, be a digital oscilloscope of the type used for general purpose trouble shooting having two, four or more vertical input channels 4. Alternatively, the serial data measurement apparatus 2 might be more along the lines of a logic state analyzer or timing analyzer specifically intended or configured for use in a serial data environment, such as RS-232 or some sort of LAN.

The various input channels 4 of the apparatus 2 are connected to points of interest in a Device Under Test 3 (DUT). These connections may be made by individual probes, which may be either attenuator probes or 1:1 probes, or they may be push-on jumpers. They could even be made by a formal connector/interface cable arrangement that is essentially a tool that provides convenience (say, by matching the connector style and pinout for an industry standard bus). In any event, some signals of interest 15, 16 and 17 are brought into the serial data measurement apparatus 2. For our present purposes we may say that those signals 15, 16 and 17 are sent two places: to a self-framing trigger circuit 10 and to the balance 18 of the apparatus 2 (i.e., to the "actual measurement" portion of the apparatus 2).

It will be understood that particulars for the balance 18 of the apparatus 2 have been omitted for the sake of brevity, and also for being somewhat tangential to the present area of interest: the self-framing serial trigger 10. That said, however, it will also be understood that the apparatus has some means of presenting results (e.g., a CRT, or, perhaps an interface to a computer, neither of which is shown) and some means of user control (e.g., front panel or remote control connector, again, neither of which is shown). We shall assume that these conventional mechanisms are present, and that in ways that are already known they account for how certain variable arrangements (modes, operational settings) are specified in functional areas of the apparatus 2 that are presently of interest to us.

To proceed then, the various inputs 15, 16 and 17 are applied to selection mechanisms 5 and 6 whose outputs are SERIAL DATA 7 and DATA CLOCK 8, respectively. That is, one of the inputs 4 is selected to be serial data and (probably another) is selected to be the associated clock signal. We have shown these selection mechanisms as single-pole multi-throw switches 5 and 6, which indeed they might be, but with the understanding that other selection mechanisms (e.g., MUX's) might also be appropriate. Further, the selection mechanisms 5 and 6 may involve no switching or MUX'ing: SERIAL DATA 7 and CLOCK DATA 8 may appear as labels on input jacks on a front panel, and the operator simply connects appropriate signals thereto. Also, the signals themselves may appear as if they are single ended signals referenced to a common ground. But what we really have shown are signal paths; it will further be understood that if one or more of those signal paths is for a balanced or differential signal, then that path contains the appropriate electronics to handle it.

If the serial data measurement apparatus 2 has more than two input channels 4 (as shown), then the associated assumption is that the apparatus 2 has modes of operation wherein the channels unselected for the serial trigger are contributors to the measurement. An example might be a four channel time domain display of waveforms in an oscilloscope triggered in an entirely conventional way from slope information derived from one of those channels. On the other hand, two of those first through fourth channels (or even fifth and sixth channels) might be construed (by a selection mechanism 5/6 as shown) as SERIAL DATA 7 and its associated DATA CLOCK 8. Then, SERIAL DATA 7 and DATA CLOCK 8 can be applied to a serial trigger circuit such as a SELF-FRAMING SERIAL TRIGGER CIRCUIT 10 to produce a signal SERIAL TRIGGER 11 that triggers the 'scope. Our interest here is in a novel way of producing a serial trigger signal; what the serial data measurement apparatus 2 does with it will depend in large part upon what kind of apparatus is it.

In this connection, the signal SERIAL TRIGGER 11 may not be the trigger signal of interest at all for the particular measurement at hand. To this end a switch 12 allows any of SERIAL TRIGGER 11 or OTHER TRIGGER SIGNALS 13 to be selected as a signal MAIN TRIGGER 14, which is the actual trigger signal used by the serial data measurement apparatus 2. The OTHER TRIGGER SIGNALS 13 would be produced by additional trigger signal circuits, which for the sake of brevity, have been omitted.

We proceed now with a description of the self-framing serial trigger circuit 10. It has as inputs SERIAL DATA 7, DATA CLOCK 8 and a TRIGGER PATTERN & FRAMING PULSE DEFINITION 9. The TRIGGER PATTERN is the ordered sequence of bits that is to occur at SERIAL DATA 7 to produce the output signal SERIAL TRIGGER 11. The notion of a framing pulse definition is simply a mode of operation and perhaps an associated parameter or two that specifies how to identify the start of a serial word, and also perhaps where in a sequence of words (a record) a trigger pattern is to be sought. The idea is that this mode and parameter information is supplied once as instructions and data, whence it thereafter remains in force until changed. Either static dedicated control lines or a bus architecture, or perhaps a combination of the two, may be used to convey the TRIGGER PATTERN & FRAMING PULSE DEFINITION 9. This information would originate with the user and be set in place using the overall means for controlling the apparatus 2 (e.g., a front panel with controls and a CRT display). The same applies for how switches 5, 6 and 12 are set.

Figure 2:
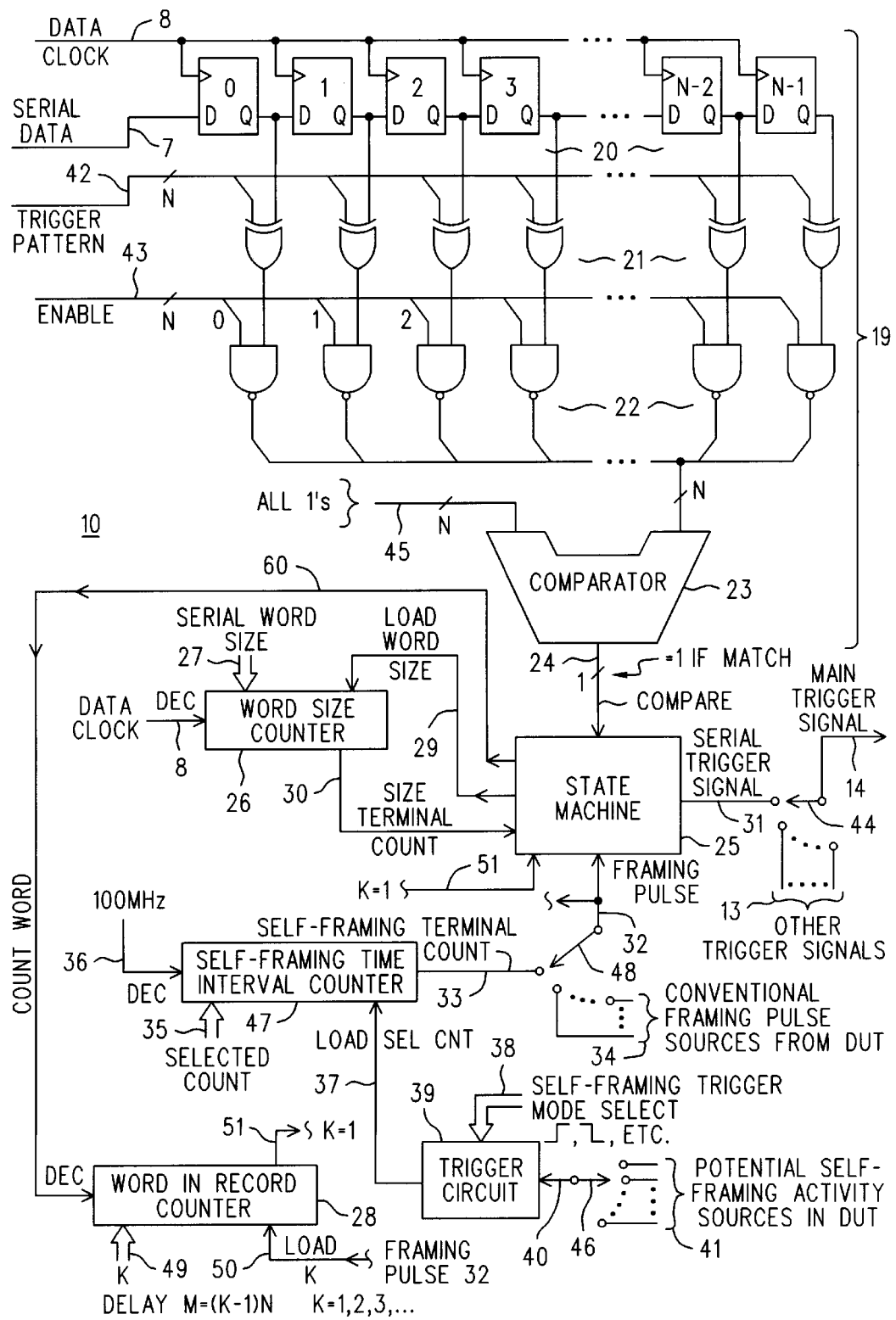
FIG. 2 is a simplified expansion in block diagram form of the self-framing serial trigger circuit of FIG. 1.

Refer now to FIG. 2, wherein is shown in simplified block diagram form an expansion of the self-framing serial trigger circuit 10 of FIG. 1. At the top of the block diagram is a pattern matching circuit 19 that is arranged to detect the occurrence of an N-bit pattern in the serial data 7. To accomplish this a collection 20 of N-many latches is connected as a serial chain (shift register), representing bits 0 through N-1 of the actual pattern occurring in the serial data 7. The serial chain of latches 20 is formed by connecting the Q output of each latch to the D input of the next latch in the chain. The input SERIAL DATA 7 goes to the D input of the first latch in the chain. Each of the latches in the chain 20 is clocked by DATA CLOCK 8. The Q outputs of the chain 20 thus represents the last N-many bits (actual pattern) that have occurred in SERIAL DATA 7.

That collection of Q outputs is applied to a collection 21 of N-many exclusive OR (XOR) gates; one input of each XOR gate is a Q output from chain 20, while the other is the corresponding bit of the trigger pattern 42 (part of 9 as shown in FIG. 1). The XOR gates act as bit-by-bit comparators. The output of an XOR gate is true if one or the other of its inputs is true, but not both. Accordingly, the output of each XOR gate in collection 21 is true whenever the associated bits in the actual pattern and the trigger pattern do not match; during the remaining possibilities of both inputs true and neither input true, (i.e., they match) the output for the XOR gate is false.

The N-many outputs from the collection 21 of XOR gates is applied to a collection 22 of NAND gates. Each NAND gate is to produce a true output when its bit position satisfies the corresponding position in the trigger pattern. To allow bit positions to be withdrawn from consideration in the trigger pattern, each NAND gate receives one of N-many enable bits 43. To not enable a NAND gate its associated ENABLE bit is made a zero. Then, if the other input to that NAND gate (from the associated XOR gate) should be zero (otherwise meaning no match), the output of that NAND gate will still be true (not enabled forces satisfaction of that bit position). The output of each of the NAND gates will be true if either one of the inputs is false, regardless of the other. That is, if that bit position is made a "don't care" position (not ENABLE'd), or, if the pattern at that bit position matches. The only time a NAND gate in the collection 22 will have a false output is when it has two true inputs, which is to say that the bit position has been ENABLE'd and the pattern at that bit position does not match.

Thus, the serial trigger pattern detection process now devolves into the task of determining if all the outputs from the NAND gates in the collection 22 are true. This condition is determined by comparator 23; it is an N-section bit-wise comparator that receives N-many 1's as one set of inputs 45 and the N-many outputs from the NAND gates 22 as the other set of inputs. It produces a true signal on its output signal COMPARE 24 whenever both sets of inputs are all 1's.

Now, we cannot declare successful satisfaction of a serial trigger criterion simply on the strength of a 1 occurring on signal COMPARE 24. We cannot, because those N-many bits combining to meet the trigger pattern might not belong to the same word; they might be a trailing part of the previous word and the leading part of the next word. Accordingly, signal COMPARE 24 is supplied to a state machine 25 that receives other information that is sufficient to determine if the pattern match has occurred at the end of a word. Part of that information is a signal SIZE TERMINAL COUNT 30, which may be understood as being an end-of-word signal. That signal 30 is produced by first loading a counter 26 with a value 27 equal to the serial word size upon the occurrence of a LOAD WORD SIZE signal 29 produced by the state machine 25 in response to a signal FRAMING PULSE 32. The counter counts (say, it decrements) once each cycle of DATA CLOCK 8. When the terminal count of zero is reached signal 30 goes true to indicate that the end of a serial word has occurred. (If there were a records-in-a-word structure in use, then value 27 would be smaller than the record size. In such a circumstance the state machine might also issue the signal LOAD WORD SIZE 29 in response to signal 30, too, so as to assist by continuing word identification within the record and inbetween framing pulses.)

In any event, the state machine 25 issues a SERIAL TRIGGER signal 31 whenever the raw pattern match signal COMPARE 24 occurs in proper relation to the SIZE TERMINAL COUNT signal 30 and the FRAMING PULSE 32. The signal SERIAL TRIGGER 31 is applied to a switch 44 through which it may become the signal MAIN TRIGGER 14 when the serially triggered mode of operation is in effect. There may, of course, be other modes of triggering, and these are represented by the OTHER TRIGGER SIGNALS 13 applied to the remaining poles of switch 44.

Our interest now becomes how the signal FRAMING PULSE 32 is generated. Note that a switch 48 allows FRAMING PULSE 32 to originate either with a SELF-FRAMING TIME INTERVAL COUNTER 47 or with any appropriate signal ("conventional framing pulse sources" 34) obtained from the device under test 3. Assuming now that none of 34 are in use, and that the self-framing feature is, switch 48 will be in the position shown. In that position a signal SELF-FRAMING TERMINAL COUNT 33 becomes FRAMING PULSE 32. SELF-FRAMING TERMINAL COUNT 33 is produced whenever the SELF-FRAMING TIME INTERVAL COUNTER 47 reaches its terminal count after having been loaded with a value 35 SELECTED COUNT. Loading occurs upon the occurrence of a signal LOAD SEL CNT 37. The counting is done according to a clock signal 36, whose frequency is high enough to allow adequate resolution, say, 100 MHz.

Recall that the idea behind self-framing is that an absence of activity can be used as a framing pulse. So, the idea is to use indications of activity to load and re-load SELF-FRAMING TIME INTERVAL COUNTER 47. If it ever reaches its terminal count it will mean that there has just been a period of inactivity long enough to qualify as the framing pulse. Thus, the SELECTED COUNT 35 is chosen, in view of the frequency of clock signal 36, to represent that period of inactivity.

Now our interest shifts to how the signal LOAD SEL CNT 37 is generated; it must reflect "activity" in the DUT 3. Signal 37 is produced by a trigger circuit 39, which may be a conventional oscillographic trigger circuit whose input signal 40 is obtained at the pole of a switch 46 whose throws are connected (by the operator as he sees fit) to various potential self-framing activity sources 41 in the DUT 3. The trigger circuit 39 is further responsive to a self-framing trigger mode selection signal(s) 38, that actually determines under what conditions signal 37 (LOAD SEL CNT) will be produced from (selected) input signal 40. For example, the trigger criterion (38) could be any positive transition of at least a certain magnitude. The trigger criterion can be as fancy or as plain as desired; we offer the type of trigger selection ordinarily found in a regular oscilloscope as instructive of what types of triggering may be useful. (Indeed, trigger circuit 39 could well be the source of the OTHER TRIGGER SIGNALS 13.) Just bear in mind that in this particular context of loading counter 47, "triggering" with trigger circuit 39 means "Aha, activity!" and does not mean "Make a SERIAL TRIGGER signal 11". Also, there need not be a switch 46; signals 41 might be just a single signal supplied to a jack on the panel of the apparatus 1. Furthermore, the signal selected for being the source of the "activity measurement" just described might be the same as, or equivalent to, DATA CLOCK 8, or, it might be some other signal in the DUT 3.

The only items of FIG. 2 remaining to be discussed are an optional WORD IN RECORD COUNTER 28 and its associated signals. Counter 28 is present if there is to be a record structure composed of a plurality of words of N-bits each, and the serial trigger is to be based upon the Kth word in the record (K=1, 2, 3, ... ). Recall that earlier we mentioned the desirability of an M-bit delay past the framing pulse before allowing the serial trigger. We now show how this may be done in the case where M=(K−1)N, which implies that we disallow the arbitrary case that lets a trigger word straddle word boundaries. (M could be arbitrary if desired; only a modest increment in complexity over what we show here would be required. It is more that if word boundaries are to be straddled, why have words in the first place? Simply let N be for the whole record, and use the don't care/enable feature to select the bits of interest.)

From the figure it can be seen that WORD IN RECORD COUNTER 28 is loaded with a value K 49 in response to a signal LOAD K 50, which is logically the same as the signal FRAMING PULSE 32. At times when the WORD SIZE COUNTER 26 indicates with SIZE TERMINAL COUNT 30 that a word boundary has been reached, the state machine 25 will issue a signal COUNT WORD 60. It decrements the count in WORD IN RECORD COUNTER 28. The terminal value of that count will be one, which is indicated by the signal K=1 51.

Figure 3:
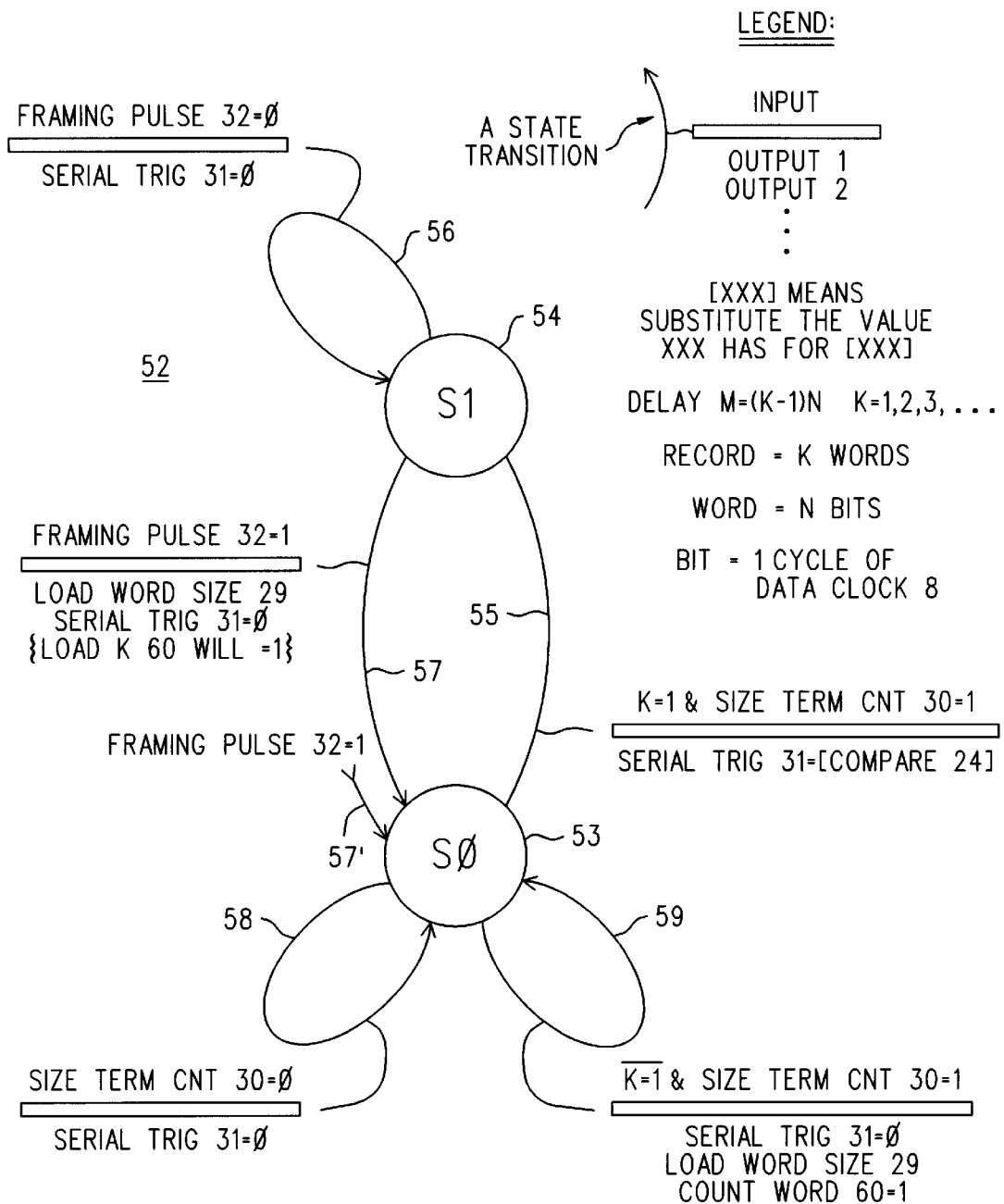
FIG. 3 is a simplified state machine diagram of a state machine in the block diagram of FIG. 2.

Refer now to FIG. 3, which is a simplified state diagram 52 of the state machine 25. The state diagram 52 includes two states S0 53 and S1 54 that are variously connected with five state transitions 55–59.

A good place to begin is with transition 57 into S0 53. That transition occurs if the FRAMING PULSE 32 is a one. Transition 57 will ordinarily occur out of state S1 54 (transition 57' is a turn-on/start-up case). An accompanying output will be LOAD WORD SIZE 29 (from the state machine 25 itself) and LOAD K 60 (either logically identical to the framing pulse or perhaps actually issued by the state machine). These outputs set the WORD SIZE COUNTER 26 to a bit position at the start of a word and the WORD IN RECORD COUNTER 28 to a word position that is at the trigger word position within the record.

Once in state S0 53 there are three possible transitions: 58, 59 and 55. Transition 58 remains in state S0 53, and represents the case where the word count in WORD SIZE COUNTER 26 has not yet counted to the end of a word; recall that it counts according to DATA CLOCK 8, which is not a signal known to the state machine 25. When WORD SIZE COUNTER 26 has counted to the end of a word the signal SIZE TERMINAL COUNT 30 (for brevity shown in the state diagram as SIZE TERM CNT 30) will be a one. In the (optional word in a record) case of transition 59, K is not (yet) down to one, so no serial trigger is issued (the word in hand is not the trigger word), the SERIAL WORD SIZE 27 is reloaded into counter 26, and the value of K is decremented by issuing COUNT WORD 60. In the case of transition 55, K has been counted down to one (or is not a term in the state diagram because optional counter 28 is absent), so SERIAL TRIG(GER) 31 is made to be the same value as presently possessed by the signal COMPARE 24. This is the only time that SERIAL TRIGGER 31 might be a one.

Transition 55 enters state S1 54. This state has a wait loop transition 56 where nothing happens until FRAMING PULSE 32 occurs. When it does there is another transition 57, which is where we came in.

It will be appreciated by those skilled in the art that the scope of activity for the state machine 25 could be much greater than what we have shown here, which is admittedly pretty simple. It is not clear that one would resort to a genuine state machine solely for the task of self-framing a serial trigger. It seems likely that other aspects of triggering and mode control could be made part of the activity of such a state machine. However, if we were to show a more complicated state machine the extra functionality included would only obscure the nature of the self-framing task that is of interest here. What is more, nothing instructive would be gained anyway, since how to make truly complicated, yet fully minimized, state machines using computer aided design programs is already quite well known.

We claim:

1. A method of triggering a serial data measurement apparatus comprising the steps of:
   (a) connecting the apparatus to a source of serial data organized as records composed of a plurality of n-bit words;
   (b) connecting the apparatus to a clock signal associated with the serial data;
   (c) specifying an n-bit trigger pattern;
   (d) specifying a first time interval;
   (e) specifying a second time interval corresponding to the clocking of an integral number of n-bit words;
   (f) generating a framing signal upon the occurrence of a selected edge of the clock signal subsequent to an absence of transitions in the clock signal at least equal in length to the first time interval, the framing signal indicating the start of a record in the serial data;
   (g) comparing the n-bit trigger pattern against the n-many bits of the serial data that occur subsequent to a delay equal to the second time interval following the occurrence of the framing signal; and
   (h) triggering the serial data measurement apparatus upon a successful comparison in step (g).

* * * * *